United States Patent
Chiu

(10) Patent No.: US 10,320,051 B2
(45) Date of Patent: Jun. 11, 2019

(54) HEAT SINK FOR 5G MASSIVE ANTENNA ARRAY AND METHODS OF ASSEMBLING SAME

(71) Applicant: Intel Corporation, Santa Clara, CA (US)

(72) Inventor: Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/638,715

(22) Filed: Jun. 30, 2017

(65) Prior Publication Data

US 2019/0006731 A1 Jan. 3, 2019

(51) Int. Cl.
*H01Q 1/02* (2006.01)
*H05K 7/20* (2006.01)

(52) U.S. Cl.
CPC ........... *H01Q 1/02* (2013.01); *H05K 7/20336* (2013.01); *H05K 7/20963* (2013.01); *H05K 7/20127* (2013.01)

(58) Field of Classification Search
CPC .. H01Q 1/02; H05K 7/20963; H05K 7/20336; H05K 7/20127; H05K 7/20154; H05K 7/20163; H05K 7/20409; H05K 7/20418; H05K 7/20854; H05K 7/209; H05K 7/2039; H05K 7/2029; F21V 29/2212; H01C 1/084; H01L 23/36
USPC .......... 361/709, 679.54, 700; 165/80.4–80.5, 165/104.33; 257/714
See application file for complete search history.

(56) References Cited

U.S. PATENT DOCUMENTS

| | | | | |
|---|---|---|---|---|
| 6,914,780 B1* | 7/2005 | Shanker | ............ | F28D 15/0233 165/104.33 |
| 8,353,333 B2* | 1/2013 | Chen | ............ | F28D 15/0275 165/104.33 |
| 8,881,793 B2* | 11/2014 | Huang | ............ | F28D 15/0275 165/104.33 |
| 9,466,551 B1* | 10/2016 | Reist | ............ | H01L 23/473 |
| 9,468,086 B1* | 10/2016 | Yeini | ............ | H01L 23/427 |
| 2007/0069369 A1* | 3/2007 | Hou | ............ | H01L 23/36 257/706 |
| 2010/0002395 A1* | 1/2010 | Bertrou | ............ | H05K 7/1404 361/700 |
| 2012/0001809 A1* | 1/2012 | Peng | ............ | H01Q 1/02 343/702 |
| 2014/0036445 A1* | 2/2014 | Okamoto | ............ | H05K 7/20209 361/697 |
| 2014/0084441 A1* | 3/2014 | Chiu | ............ | H01L 23/13 257/692 |
| 2018/0005985 A1* | 1/2018 | Hsieh | ............ | H01L 23/367 |

FOREIGN PATENT DOCUMENTS

DE 102018112990 1/2019

* cited by examiner

*Primary Examiner* — Anatoly Vortman
*Assistant Examiner* — Stephen S Sul
(74) *Attorney, Agent, or Firm* — Schwegman Lundberg & Woessner, P.A.

(57) ABSTRACT

A massive array antenna apparatus is configured with a cantilevered heat pipe that allows a semiconductive millimeter-wave device to move independently from a heat-sink base during thermal expansion and contraction.

22 Claims, 12 Drawing Sheets

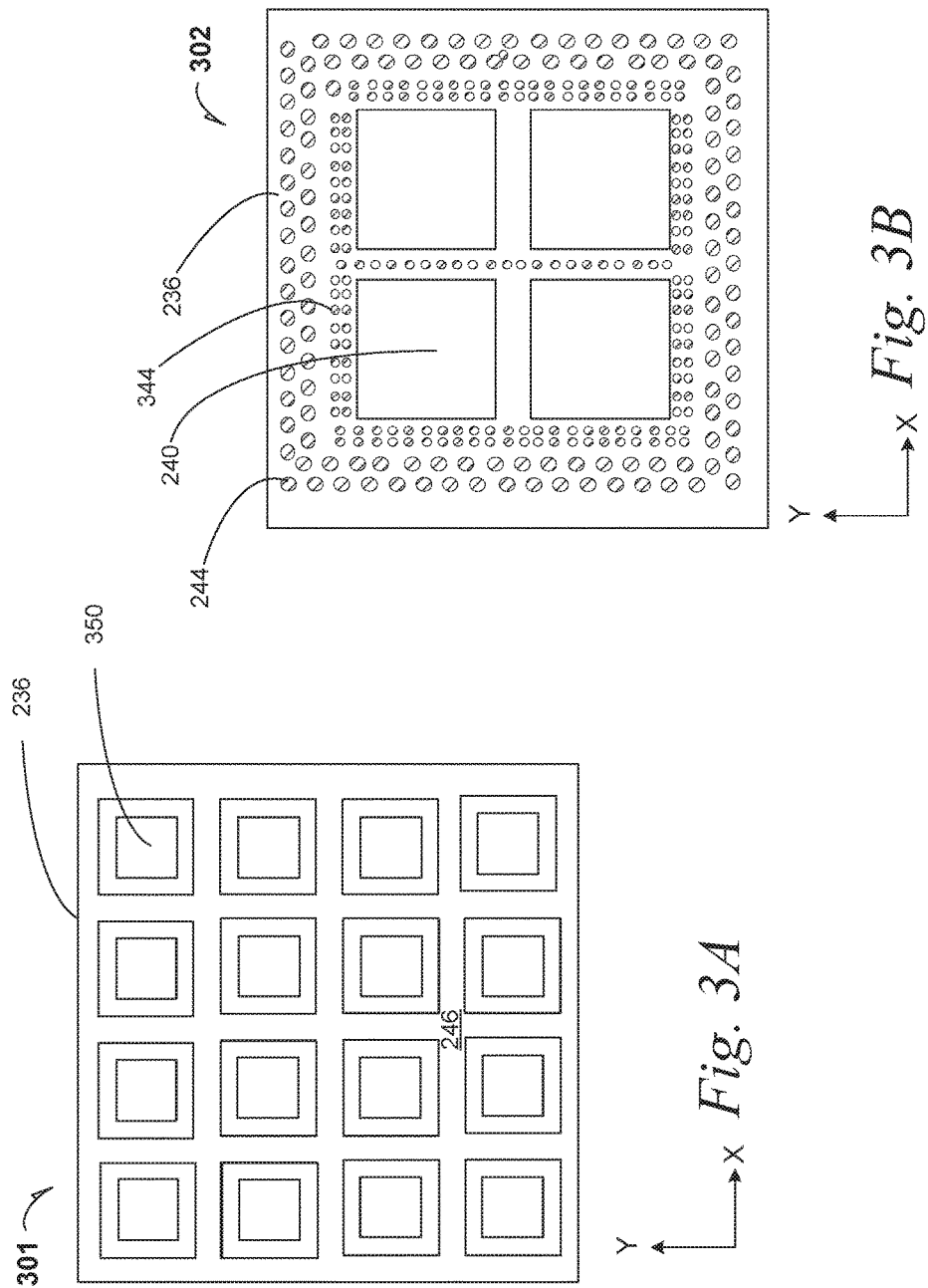

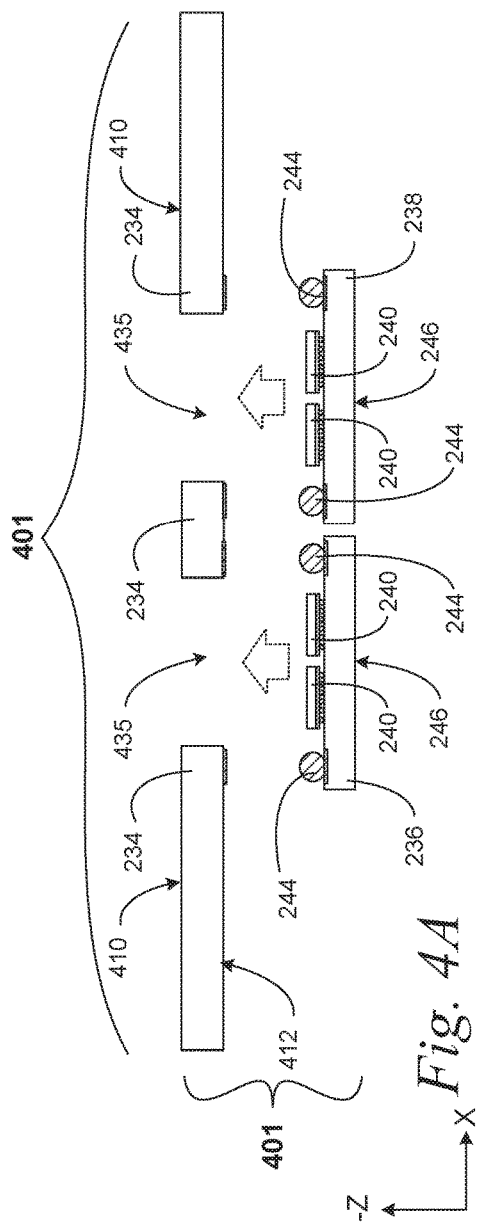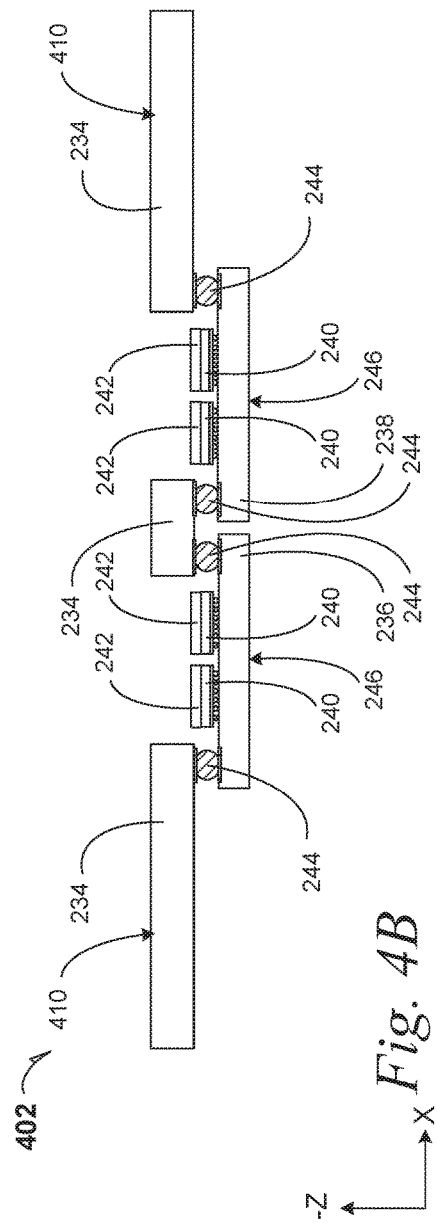

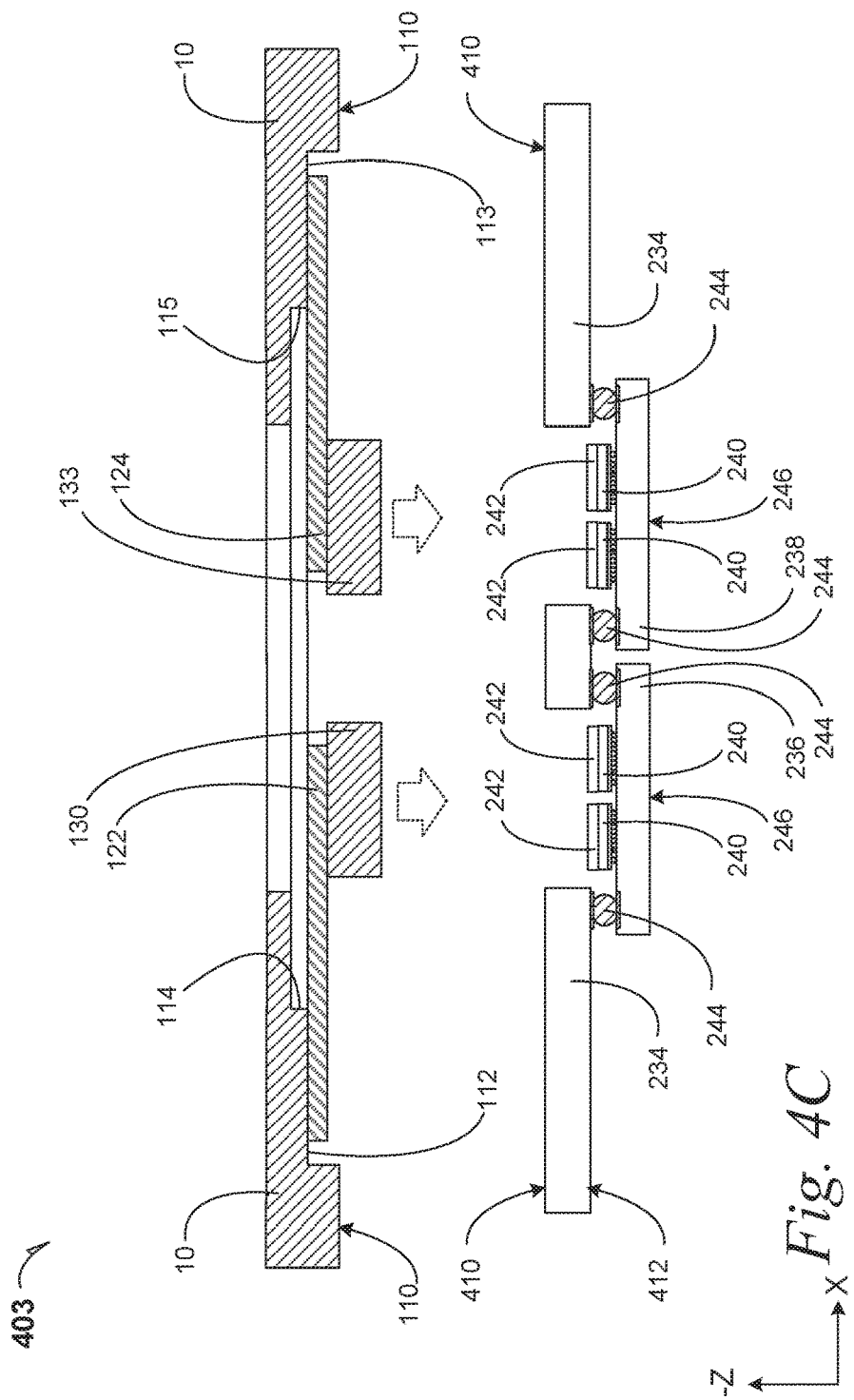

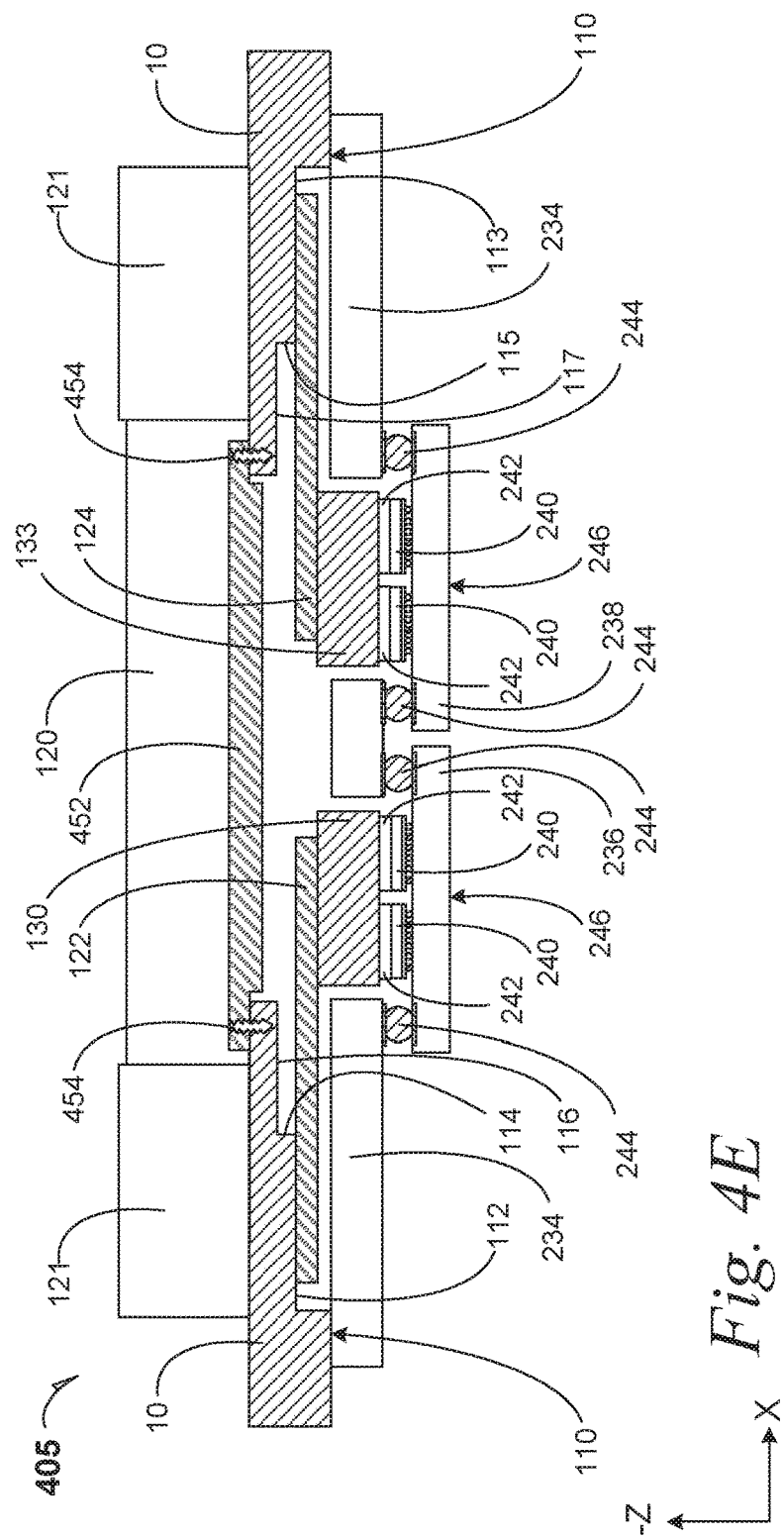

HEAT SINK FOR 5G MASSIVE ANTENNA ARRAY AND METHODS OF ASSEMBLING SAME

FIELD

This disclosure relates to heat management for 5G massive antenna array (MAA) devices and methods of assembling heat-transfer apparatus.

BACKGROUND

Semiconductive device miniaturization creates footprint challenges during assembly of several dice into a package as device and package sizes continually shrink.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 3A is a top plan of a massive antenna array package substrate that supports a massive antenna array according to an embodiment;

FIG. 3B is a bottom plan of the massive antenna array package substrate depicted in FIG. 3A according to an embodiment;

FIG. 4A is a cross-section elevation of a printed wiring board and massive antenna array package substrate assembly during processing according to an embodiment;

FIG. 4B is a cross-section elevation representing assembly of the printed wiring board and the respective massive antenna array package substrates according to an embodiment;

FIG. 4C is a cross-section elevation of the assembly depicted in FIG. 4B after further processing according to an embodiment;

FIG. 4E is a cross-section elevation of the massive antenna array assembly depicted in FIG. 4D after further processing according to an embodiment;

DETAILED DESCRIPTION

Transient thermal stress in a massive array antenna (MAA) apparatus is addressed by allowing subsets of the MAA apparatus to locally respond to the transient thermal stresses. Interconnect integrity is improved by isolating locally disrupting transient thermal stress. Heat transfer is improved between a semiconductive millimeter wave (mmWave) device and a heat sink by allowing a usefully thin thermal interface material (TIM) that bonds the semiconductive mmWave device to a pedestal. The pedestal moves upon a cantilevered heat pipe that localizes the transient thermal stresses. The cantilevered heat pipe enables transient heat flow into a heat-sink base that is convectively cooled as useful for an MAA apparatus to operate in the field.

Figure 1A:
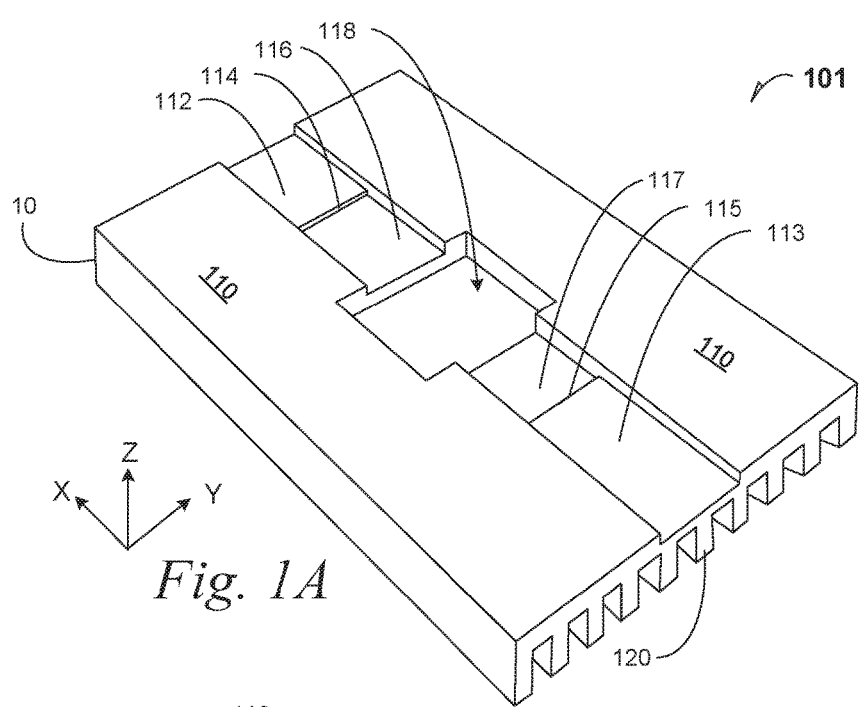
FIG. 1A is a perspective elevation of a heat-sink base during assembly of a massive array antenna apparatus according to an embodiment.

FIG. 1A is a perspective elevation 101 of a heat-sink base 10 during assembly according to an embodiment. In an embodiment, the heat-sink base 10 is a high thermal conductivity metal such as aluminum. In an embodiment, the heat-sink base 10 is a high thermal conductivity metal such as copper. In an embodiment, the heat-sink base 10 is a high thermal conductivity metal such as silver. Other high thermal-conductivity materials such as graphite, carbon nanotube, or graphene may be used as needed for a given application.

The heat-sink base 10 includes a printed wiring board (PWB) mounting surface 110. The heat-sink base 10 also includes a heat-pipe landing 112 that is set below (in the Z-direction) the PWB mounting surface 110. Further, a step 114 (also referred to as a cantilever step 114) separates the heat-pipe landing 112 from a cantilever recess 116 that is set below the heat-pipe landing 112. The cantilever recess 116 provides space for a given heat pipe to flex in the Z-directions under transient thermal stress conditions. Below the level of the cantilever recess 116, an access opening 118 that may be referred to as a massive antenna array (MAA) access opening 118 forms an opening through the heat-sink base 10. In an embodiment, cooling of the heat-sink base 10 is assisted by a series of cooling fins, one of which is indicated by the reference number 120. In an embodiment, the MAA access opening 118 is referred to as an opening in the heat-sink base 10.

In an embodiment, the heat-sink base 10 is bilaterally symmetrical when top viewed, such as can be seen in FIG. 1A. Accordingly, the first heat-pipe landing 112 is complemented by a subsequent heat-pipe landing 113. The first step 114 is complemented by a subsequent step 115 (also referred to as a subsequent cantilever step 115). And the first cantilever recess 116 is complemented by a subsequent cantilever recess 117.

Figure 1B:
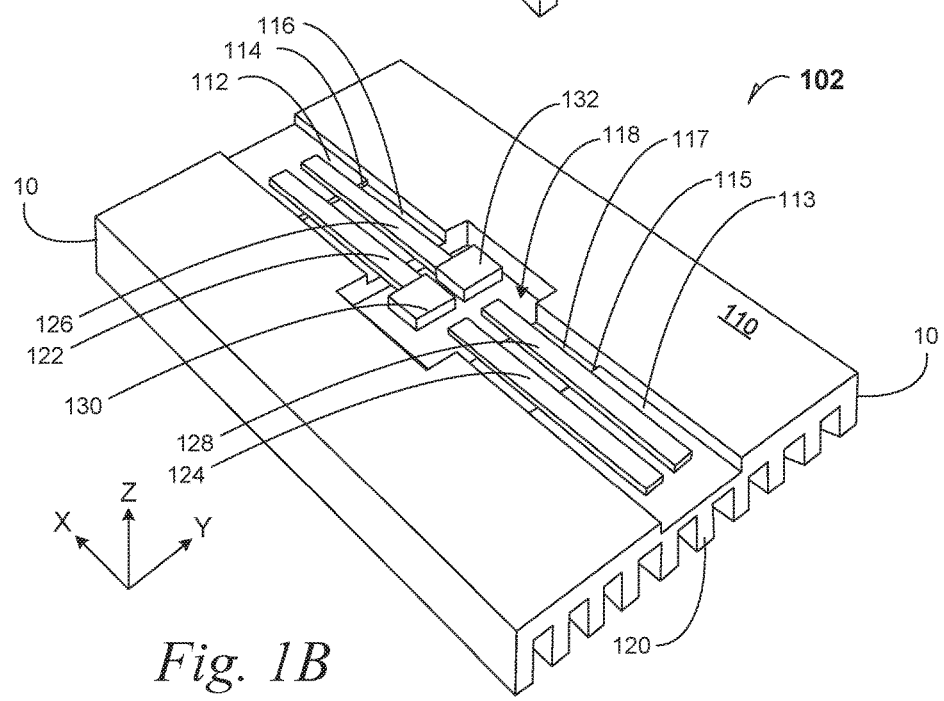
FIG. 1B is a perspective elevation of the heat-sink base depicted in FIG. 1A after further processing according to an embodiment.

FIG. 1B is a perspective elevation 102 of the heat-sink base 10 depicted in FIG. 1A after further processing according to an embodiment.

A first heat pipe 122 is disposed on a heat-pipe landing 112. A subsequent heat pipe 124 is also disposed on a heat-pipe landing 113, and the first and subsequent heat pipes 122 and 124, respectively, extend toward each other and terminate above the antenna array recess 118. The first heat pipe 122 also is assembled to a first pedestal 130. The subsequent heat pipe 124 is depicted without a pedestal for illustrative purposes to show among other features, where the subsequent heat pipe 124 extends into the antenna array recess 118.

Each heat pipe may be described to have three sections: a pedestal section that is attached to, e.g., a first pedestal 130, a landing section that is attached to, e.g., the first landing 112, and a cantilever section that separates the pedestal section from the landing section.

In an embodiment, the first heat pipe 122 has a thermal conductivity that is at least as high as that of the heat-sink base 10. In an embodiment, the first heat pipe 122 has a thermal conductivity that is higher than the heat-sink base 10.

In an embodiment, the first and subsequent heat pipes 122 and 124 are complemented with third and fourth heat pipes 126 and 128, respectively. As illustrated, the third heat pipe 126 is also depicted with a third pedestal 132, and the fourth heat pipe 128 is depicted without a pedestal for illustrative purposes to show among other features, where the fourth heat pipe 128 extends into the antenna array recess 118.

Figure 1C:
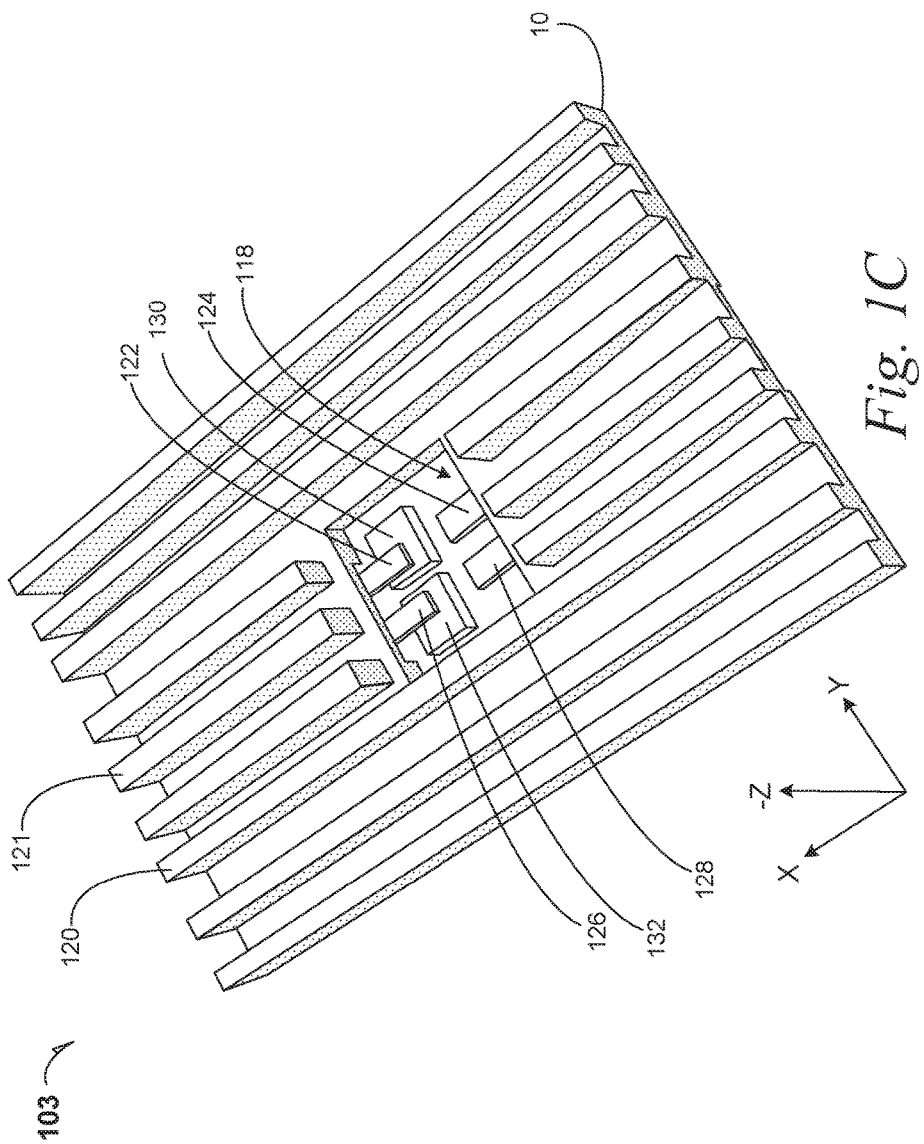
FIG. 1C is a perspective elevation of the heat-sink base depicted in FIG. 1B after inverting according to an embodiment.

FIG. 1C is a perspective elevation 103 of the heat-sink base 10 depicted in FIG. 1B after inverting according to an embodiment. The Z-direction is given in negative-Z terms to reflect inversion of the heat-sink base 10 by rotating it 180° about the X-direction axis.

The heat-sink base 10 depicts fins 120 that extend along substantially the entire length in the X-direction, as well as a subset of broken fins 121 that extend to the antenna array recess 118.

The first heat pipe 122 is depicted attached to the first pedestal 130. Essentially, the pedestal end of the subsequent heat pipe 124 is seen through the antenna array recess 118. The third heat pipe 126 is depicted attached to the third pedestal 132. Essentially, the pedestal end of the fourth heat pipe 128 is seen through the antenna array recess 118.

In an embodiment, other cooling structures other than a fin is used. For example, a series of pillars is used in place of the illustrated fins 120 and 121, where the pillars are arranged in a pattern such as in rows. In an embodiment, pillars are dense packed such as a body-centered hexagonal arrangement.

Figure 2:
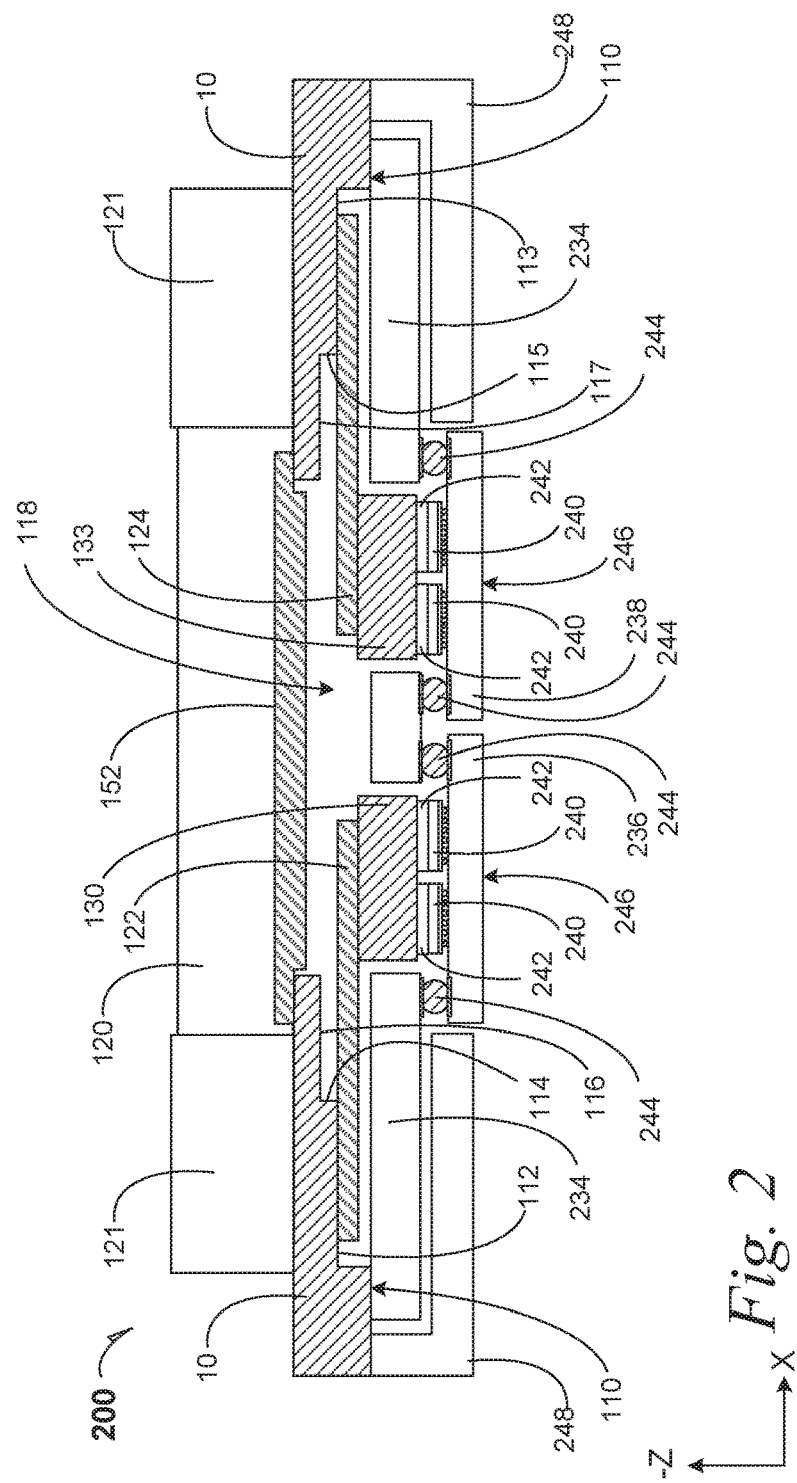
FIG. 2 is a cross-section and part cutaway elevation of a 5G massive antenna array apparatus according to an embodiment.

FIG. 2 is a cross-section and part cutaway elevation of a 5G massive antenna array (MAA) apparatus 200 according to an embodiment. The MAA apparatus 200 includes a printed wiring board (PWB) 234 on which is mounted at least one MAA package substrate 236. Together with the MAA package substrate 236 and the PWB 234, these structures and functionalities may be referred to as a heat-generating device.

The heat-sink base 10 is depicted inverted compared to the illustration of FIGS. 1A and 1B. The PWB mounting surface 110 is shown near both lateral extremes of the heat-sink base 10 and a printed wiring board 234 is shown interfacing at the PWB mounting surfaces 110. The heat-sink base 10 also indicates the heat-pipe landing 112 as well as the heat-pipe landing 113 and respective first and subsequent heat pipes 122 and 124 extend from the respective heat-pipe landings 112 and 113. In an embodiment, a heat-sink cap 152 is placed to close the massive antenna array access 118 (see FIGS. 1A-1C) such that during convective cooling directed onto the fins 120 and 121, the semiconductive mmWave devices 240 are protected from direct-blast of a cooling fluid.

It is also seen that the respective first and subsequent heat pipes 122 and 124 cantilever from the respective landings 112 and 113 and below (negative-Z direction) the respective cantilever recesses 116 and 117. Attached to the respective first and subsequent heat pipes 122 and 124 are the respective first and subsequent pedestals 130 and 133.

Further structures are illustrated for the 5G MAA apparatus 200 according to an embodiment. The PWB 234 is bonded to a first MAA package substrate 236 and a subsequent MAA package substrate 238, respectively.

In an embodiment, the semiconductive mmWave device 240 is mounted on the first MAA package substrate 236. As illustrated, two occurrences of semiconductive mmWave devices 240 are depicted mounted on the first MAA package substrate 236, and in an embodiment, two semiconductive mmWave devices 240 are mounted on the subsequent MAA package substrate 238. In each instance in an embodiment four semiconductive mmWave devices 240 are mounted on each MAA package substrate in order to drive a 5G MAA that is disposed on the MAA package substrates on the surfaces that are opposite the semiconductive mmWave devices.

Assembly of the semiconductive mmWave device 240 to the heat-management structures of the heat-sink base 10 is accomplished through a thermal interface material (TIM) 242, four occurrences of which are illustrated. In an embodiment, the TIM 242 has a bond-line thickness (BLT) in the Z-direction in a range from 20 micrometer ($\mu$m) to 50 $\mu$m. In an embodiment, the BLT is from 25 $\mu$m to 40 $\mu$m. Processing is done by thermal compression bonding (TCB) of the semiconductive mmWave device 240 to both a given MAA package substrate 236 or 238 and to the TIM by pressing the pedestals 130 and 133 toward the respective MAA package substrates 236 and 238. During TCB processing a series of inter-package bumps also bond the PWB 234 to the MAA package substrates 236 and 238.

Processing to assemble the several structures includes taking care to protect antenna patches (see FIG. 3) that are on the antenna-patch surface 246 of the MAA package substrates 236 and 238 such as by using a spacer against the antenna-patch surface 246. Electrical communication between the PWB 234 and the respective MAA package substrates 236 and 238 is accomplished through a series of electrical bumps, four or which are depicted by reference number 244. In an embodiment, the several electrical bumps 244 are represented in a simplified form. One instance of electrical communication is illustrated in FIG. 3B.

In an embodiment, a front enclosure 248 is assembled to other structures such as to a rear-enclosure feature of the heat-sink base 10. The front enclosure 248 protects internal structures from weather when the MAA apparatus 200 is part of a wireless communications device such as a cell-phone tower transceiver. In an embodiment, the front enclosure 248 mates to the heat-sink base 10 and exposes the MAA package substrate at the antenna-patch surface 246.

As illustrated, two occurrences of semiconductive mmWave devices 240 are depicted mounted on the first MAA package substrate 236.

FIG. 3A is a top plan 301 of an MAA package substrate 236 that supports an MAA, one antenna patch of which is indicated with reference number 350 according to an embodiment. As illustrated, a 4-by-4 MAA is disposed on the antenna-patch surface 246 of the MAA package substrate.

The antenna-patch structure 350 may also be referred to as an antenna element 350. Accordingly in an embodiment, the antenna array depicted includes at least one row of antenna modules such that the antenna module includes an antenna sub-array having at least one column of four antenna elements 350. For example, as depicted in FIG. 3A, the antenna array on the MAA package substrate 236 includes a row of four antenna elements 350, stacked in four-element MAA columns that are concatenated along a horizontal (X-direction) axis. Thus, there are four antenna-element subgroups that are arranged, four elements each, into a single MAA module 301. According to the example depicted in FIG. 3A, the MAA module 301 includes 16 antenna elements 350 arranged in a two-dimensional array of 4 rows and 4 columns. In other embodiments, a useful antenna array includes any other number of antenna elements arranged in any other number of columns within any other number of antenna modules.

In an embodiment, the antenna elements 350 of the MAA module 301 are coupled to a common radio frequency (RF) chain. For example, as depicted in FIG. 3A, the sixteen antenna elements 350 of the MAA module 301 is may be coupled to a common RF chain.

FIG. 3B is a bottom plan 302 of the MAA package substrate 236 depicted in FIG. 1A according to an embodiment. A 2-by-2 set of semiconductive mmWave devices 240 is mounted on the MAA package substrate 236. Also, the electrical bumps 244 are depicted as a double-row of electrical connections that frame the MAA package substrate 236. A finer pitch series of electrical bumps 344 is disposed between the electrical bumps 244 and the several semiconductive mmWave devices 240 according to an embodiment.

FIG. 4A is a cross-section elevation 401 of a printed wiring board and MAA package substrate assembly during processing according to an embodiment. The several semiconductive mmWave devices 240 are assembled to the respective MAA package substrates 236 and 238. The electrical bumps 244 (depicted in a simplified embodiment) bond to the PWB 234. The PWB 234 includes the heat-sink base mounting surface 410 and an MAA package substrate mounting surface 412.

Also as depicted by the directional arrows the several semiconductive mmWave devices 240 are drawn toward the PWB 234 but are exposed through cutouts 435 of the PWB 234. In an embodiment, the cutout 435 may be referred to as a through-hole 435 in the PWB 234. The heat-sink base mounting surface 410 interfaces the PWB interface 110 on the heat-sink base 10 at the PWB mounting surface 110 (see FIG. 1).

FIG. 4B is a cross-section elevation 402 representing assembly of the PWB 234 and the respective MAA package substrates 236 and 238 according to an embodiment. The electrical bumps 244 are bonded both to the PWB 234 and the respective MAA package substrates 236 and 238. The several semiconductive mmWave devices 240 are exposed through the cutouts 435 of the PWB 234.

FIG. 4C is a cross-section elevation 403 of the assembly depicted in FIG. 4B after further processing according to an embodiment. The heat-sink base 10 is being moved toward the PWB 234 and the respective MAA package substrates 236 and 238 according to an embodiment. The PWB mounting surface 110 on the heat-sink base 10 is approaching a heat-sink base mounting surface 410 on PWB 234. The pedestals 130 and 133 are approaching TIMs 242 that are located on the backside surfaces of the several semiconductive mmWave devices 240. Further bonding of the electrical bumps 244 to both the PWB 234 and the respective MAA package substrates 236 and 238 occurs as the pedestals 130 and 133 are bonded to the TIMs 242.

The several semiconductive mmWave devices 240 are exposed through the cutouts 435 of the PWB 234. Also as depicted by the directional arrows, the several semiconductive mmWave devices 240 are approached by the pedestals 130 and 133 as the pedestals 130 and 133 are advanced through cutouts 435 of the PWB 234. In an embodiment, a given pedestal 130 supports four occurrences of a given semiconductive mmWave device 240. Thus in an embodiment, a four-pedestal MAA apparatus supports 16 semiconductive mmWave devices 240. Further in an embodiment, a four-pedestal MAA apparatus supports 16 semiconductive mmWave devices 240 and a 64-element MAA.

Figure 4D:
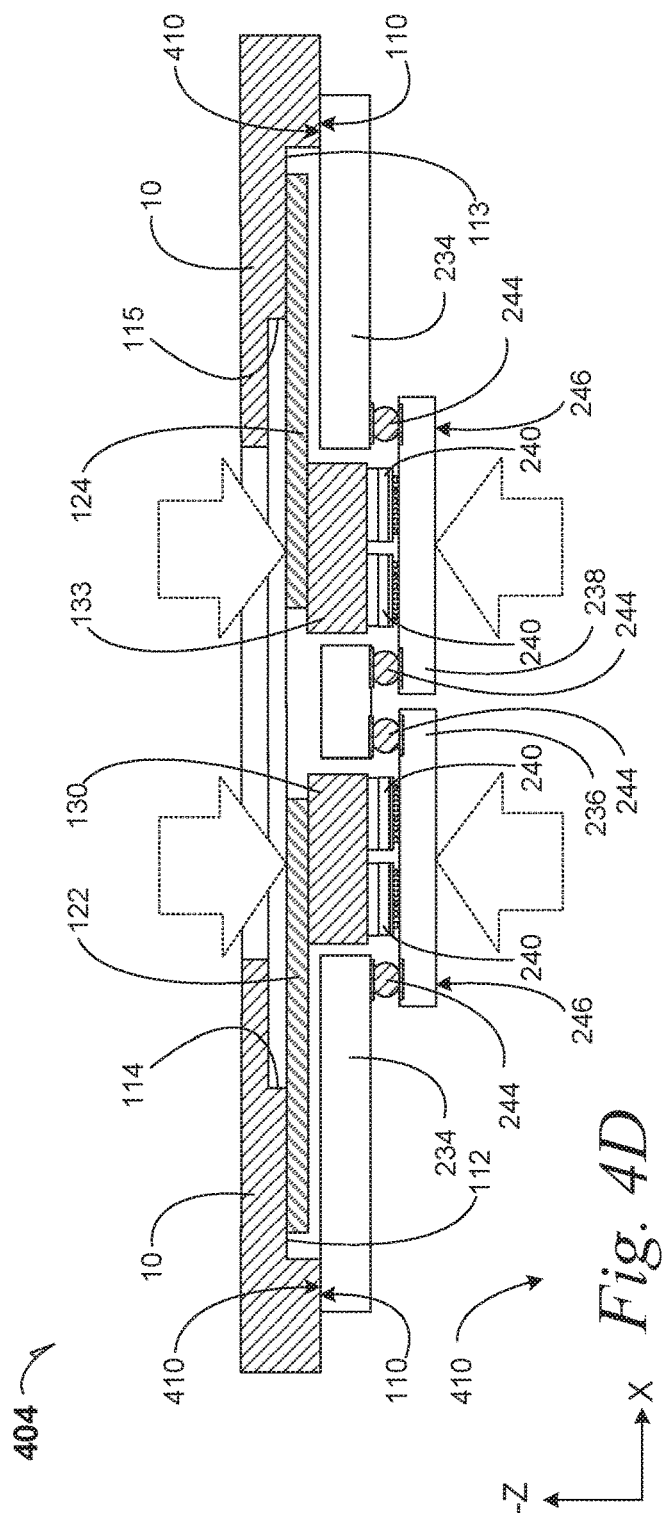
FIG. 4D is a cross-section elevation of the assembly depicted in FIG. 4C after further processing according to an embodiment.

FIG. 4D is a cross-section elevation 404 of the assembly depicted in FIG. 4C after further processing according to an embodiment. Thermal compression bonding (TCB) is carried out as indicated by the four directional arrows that illustrate pressing the heat pipes 122 and 124 onto the pedestals 130 and 133. The TCB force is also directed upwardly onto the antenna-patch surfaces 246 of the several MAA package substrates 236 and 238, respectively. In an embodiment, TCB processing continues some reflow of the electrical bumps 244, electrical bumps on the several semiconductive mmWave devices 240 onto the MAA package substrate, and the TIMs 242 (see FIG. 4C).

In an embodiment as illustrated by a plurality of force arrows, TCB forces are localized as needed.

FIG. 4E is a cross-section elevation of 405 of the MAA assembly depicted in FIG. 4D after further processing according to an embodiment. In an embodiment, the cooling fins 120 and 121 or other tall cooling structures, are integral to the heat-sink base 10. In an embodiment, the cooling fins 120 and 121, or other tall cooling structures, are brazed or welded onto the heat-sink base 10.

In an embodiment, a heat-sink cap 452 is placed to close the massive antenna array access 118 (see, e.g. FIG. 1A) such that during convective cooling directed onto the fins 120 and 121, the semiconductive mmWave devices 240 are protected from direct-blast of a cooling fluid. In an embodiment, the heat-sink cap 452 is attached such as by a bolt access 454 or a machine-screw access 454.

Reference is again made to FIG. 2. Further processing of the MAA assembly apparatus 405 depicted in FIG. 4E results in the 5G massive antenna array apparatus 200 according to an embodiment.

Figure 5:
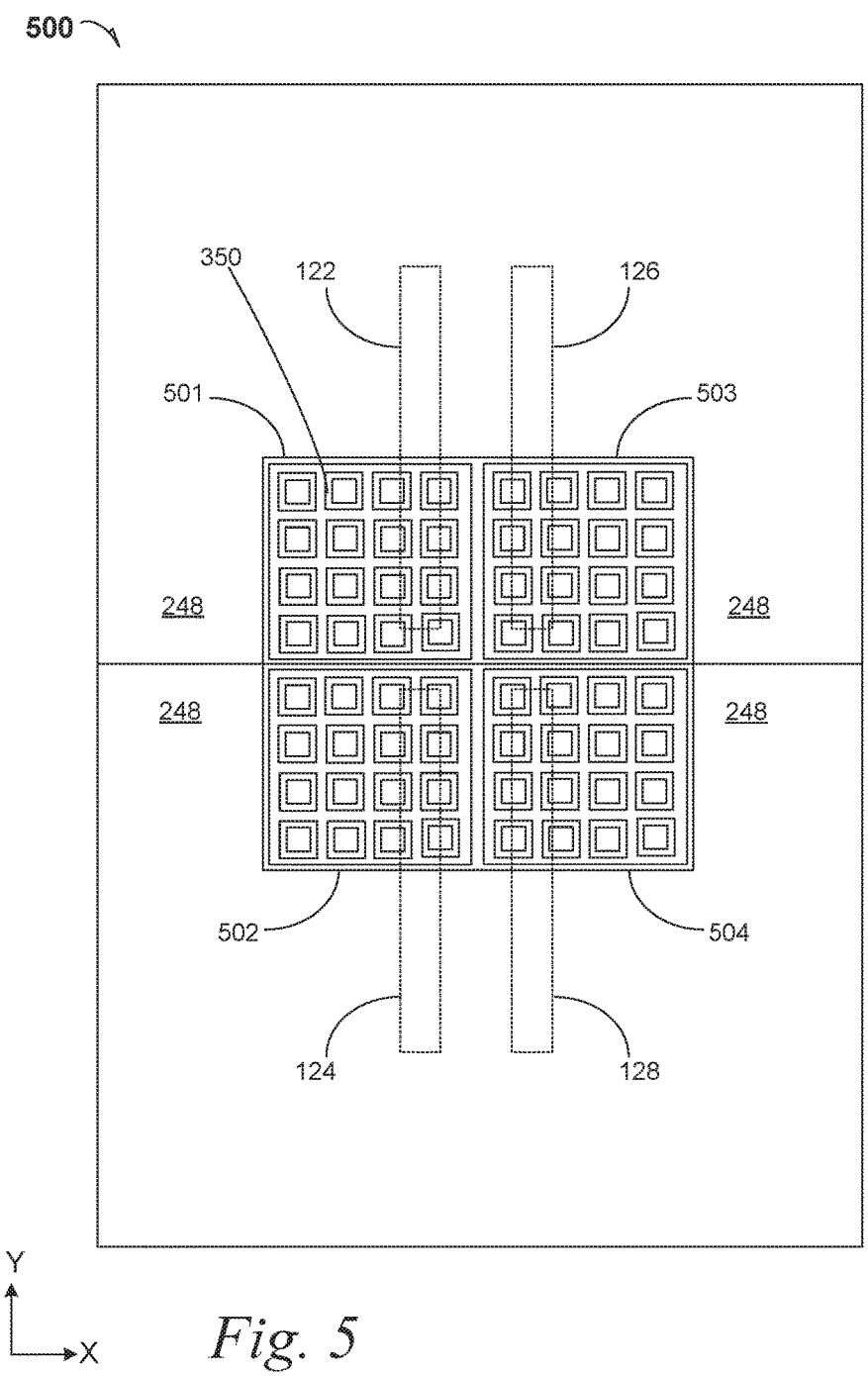
FIG. 5 is a front elevation of a massive antenna array apparatus that is arranged as four 4-by-4 modules according to an embodiment.

FIG. 5 is a front elevation of a massive antenna array (MAA) apparatus 500 that is arranged as four 4-by-4 modules according to an embodiment. A front enclosure 248 encloses structures such as the heat pipes 122, 124, 126 and 128 (depicted in ghosted lines and occurring behind the front enclosure 248). These heat pipes allow each module 501, 502 503 and 504 to flex at least in the Z-direction (orthogonal to the plane of the drawing) as transient heat flow is experienced during transceiving and the respective pedestals 130, 131, 132 and 133 may absorb disparate heat loads compared to all of them. In an embodiment, the MAA apparatus 500 is assembled to a broadcasting structure such as to a cellular communications tower.

Figure 6:
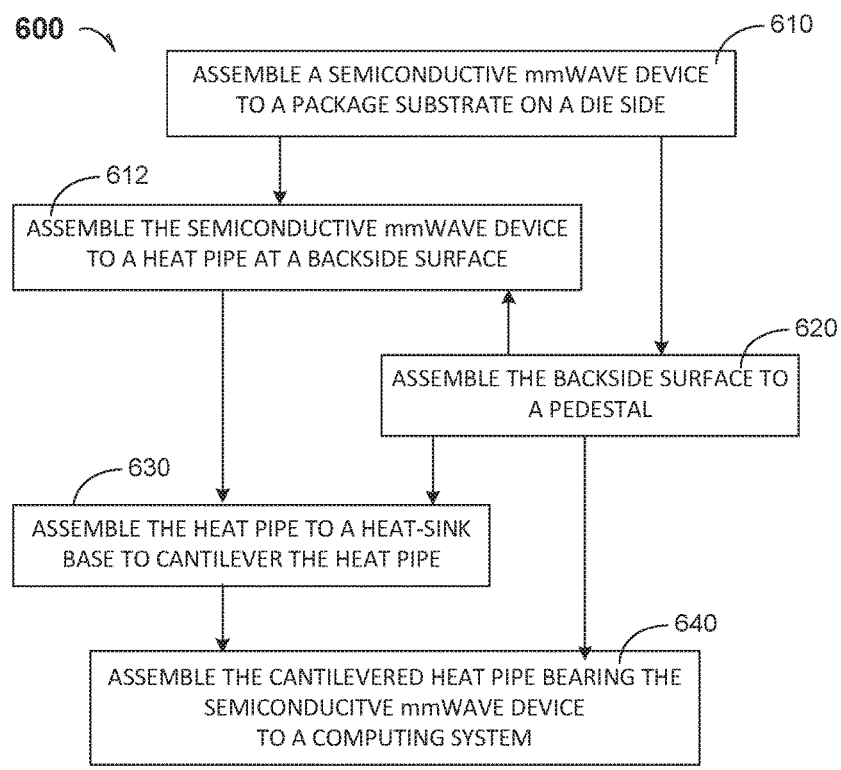
FIG. 6 is a process flow diagram according to several embodiments.

FIG. 6 is a process flow diagram 600 according to several embodiments.

At 610, the process includes assembling a semiconductive mmWave device to a massive antenna array MAA package substrate on a die side of the semiconductive mmWave device.

At 612, the process includes assembling the mmWave semiconductive device to a heat pipe at a backside surface of the mmWave semiconductive device.

At 620, the process includes assembling the backside surface to a pedestal.

At 630, the process includes assembling the heat pipe to a heat-sink base to cantilever the heat pipe.

At 640, the process includes assembling the MAA apparatus to a computing system.

Figure 7:
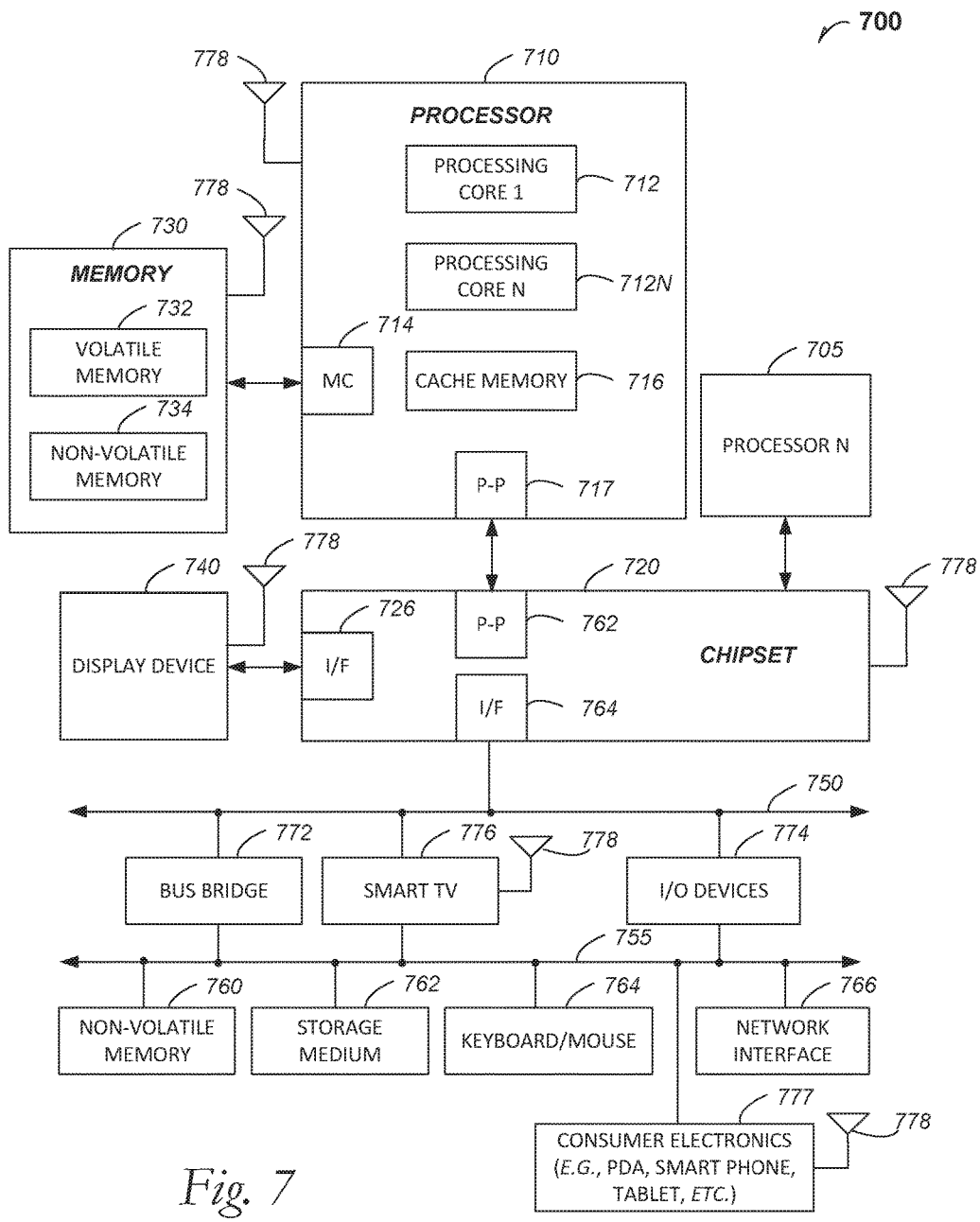
FIG. 7 is included to show an example of a higher level device application for the disclosed embodiments.

FIG. 7 is included to show an example of a higher level device application for the disclosed embodiments. The MAA cantilevered heat pipe apparatus embodiments may be found in several parts of a computing system. In an embodiment, the MAA cantilevered heat pipe is part of a communications apparatus such as is affixed to a cellular communications tower. The MAA cantilevered heat pipe may also be referred to as an MAA apparatus. In an embodiment, a computing system 700 includes, but is not limited to, a desktop computer. In an embodiment, a system 700 includes, but is not limited to a laptop computer. In an embodiment, a system 700 includes, but is not limited to a netbook. In an embodiment, a system 700 includes, but is not limited to a tablet. In an embodiment, a system 700 includes, but is not limited to a notebook computer. In an embodiment, a system 700 includes, but is not limited to a personal digital assistant (PDA). In an embodiment, a system 700 includes, but is not limited to a server. In an embodiment, a system 700 includes, but is not limited to a workstation. In an embodiment, a system 700 includes, but is not limited to a cellular telephone. In an embodiment, a system 700 includes, but is not limited to a mobile computing device. In an embodiment, a system 700 includes, but is not limited to a smart phone. In an embodiment, a system 700 includes, but is not limited to an internee appliance. Other types of computing devices may be configured with the microelectronic device that includes MAA apparatus embodiments.

In an embodiment, the processor 710 has one or more processing cores 712 and 712N, where 712N represents the Nth processor core inside processor 710 where N is a positive integer. In an embodiment, the electronic device system 700 using a MAA apparatus embodiment that includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the MAA apparatus in the system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HMV), Ultra Wide Band (UWB), Bluetooth, WiMax, or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a MAA apparatus embodiment as set forth in this disclosure. The chipset 720 enables the processor 710 to connect to other elements in the MAA apparatus embodiments in a system 700. In an embodiment, interfaces 717 and 722 operate in accordance with a PtP communication protocol such as the Intel® QuickPath interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In and embodiment, the processor 710 and the chipset 720 are merged into a MAA apparatus in a system. Additionally, the chipset 720 connects to one or more buses 750 and 755 that interconnect various elements 774, 760, 762, 764, and 766. Buses 750 and 755 may be interconnected together via a bus bridge 772 such as at least one MAA apparatus embodiment. In an embodiment, the chipset 720 couples with a non-volatile memory 760, a mass storage device(s) 762, a keyboard/mouse 764, and a network interface 766 by way of at least one of the interface 724 and 774, the smart TV 776, and the consumer electronics 777, etc.

In an embodiment, the mass storage device 762 includes, but is not limited to, a solid state drive, a hard disk drive, a universal serial bus flash memory drive, or any other form of computer data storage medium. In one embodiment, the network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the MAA apparatus embodiment in a computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

Where useful, the computing system 700 may have a broadcasting structure interface such as for affixing the MAA apparatus to a cellular tower.

Figure 8:
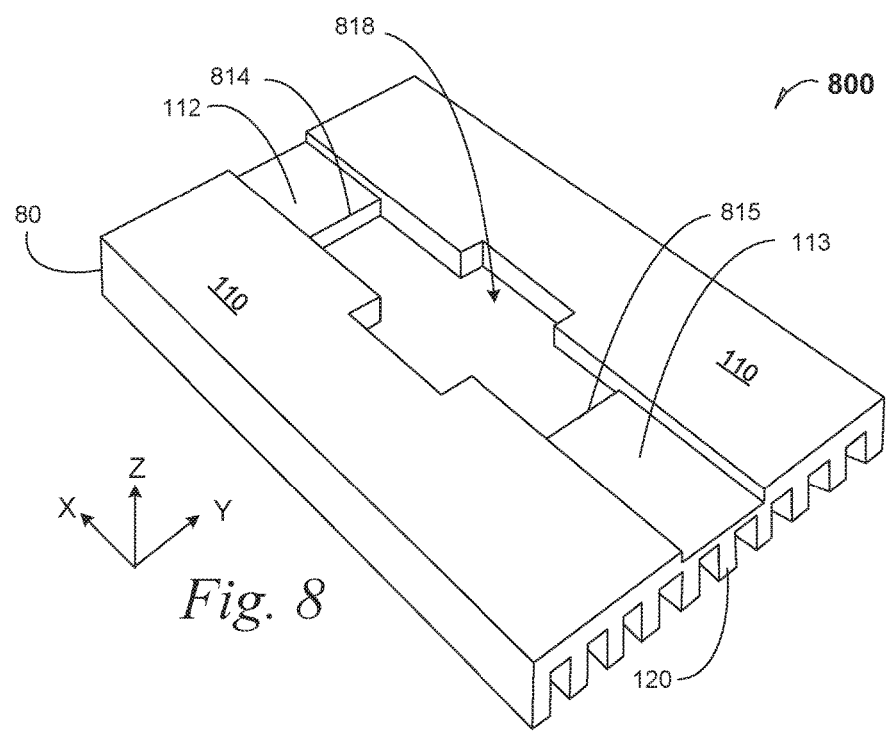
FIG. 8 is a perspective elevation of a heat-sink base during assembly according to an embodiment.

FIG. 8 is a perspective elevation 800 of a heat-sink base 80 during assembly according to an embodiment. In an embodiment, the heat-sink base 80 is a high thermal conductivity metal such as aluminum. In an embodiment, the heat-sink base 80 is a high thermal conductivity metal such as copper. In an embodiment, the heat-sink base 80 is a high thermal conductivity metal such as silver. Other high thermal-conductivity materials such as graphite, carbon nanotube, or graphene may be used as needed for a given application.

The heat-sink base 80 includes a printed wiring board (PWB) mounting surface 110. The heat-sink base 80 also includes a heat-pipe landing 112 that is set below (in the Z-direction) the PWB mounting surface 110. Further, a ledge 814 (also referred to as a cantilever ledge 814) separates the heat-pipe landing 112 from an access opening 818. The access opening 818 provides space for a given heat pipe to flex in the Z-directions under transient thermal stress conditions. The access opening 818 may be referred to as a massive antenna array (MAA) access opening 818.

In an embodiment, cooling of the heat-sink base 80 is assisted by a series of cooling fins, one of which is indicated by the reference number 120. In an embodiment, the MAA access opening 818 is referred to as an opening in the heat-sink base 80.

In an embodiment, the heat-sink base 80 is bilaterally symmetrical when top viewed, such as can be seen in FIG. 8. Accordingly, the first heat-pipe landing 112 is complemented by a subsequent heat-pipe landing 113. The first step ledge 814 is complemented by a subsequent ledge 815 (also referred to as a subsequent cantilever ledge 815).

Figure 9:
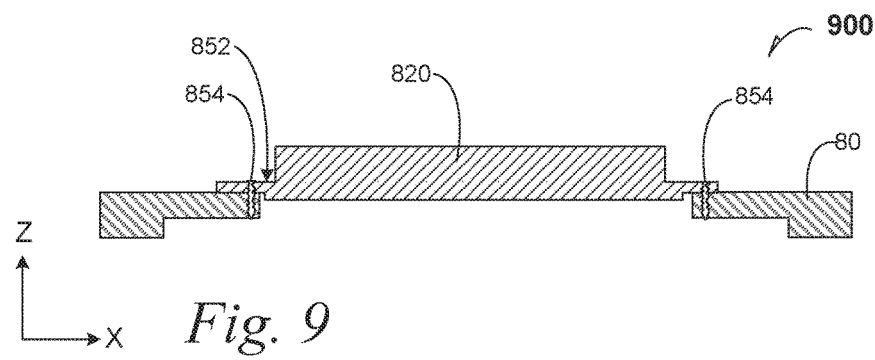
FIG. 9 is a cross-section elevation of the heat-sink base with a heat-sink cap according to an embodiment.

FIG. 9 is a cross-section elevation of the heat-sink base 80 with a heat-sink cap 852 according to an embodiment. The heat-sink cap 852 fits into the access opening 818 of the heat-sink base 80. In an embodiment, the heat-sink cap 852 includes at least one raised fin cooling fin 820. As illustrated, the raised cooling fin 820 is integral with the heat-sink cap according to an embodiment. It may be understood that any heat-sink cap embodiment may include at least one raised cooling fin to increase a heat-exchange surface. An access bolt 854 may be used to fasten the heat-sink cap 852 to the heat-sink base 80.

To illustrate the MAA apparatus embodiments and methods disclosed herein, a non-limiting list of examples is provided herein:

Example 1 is a heat-transfer apparatus, comprising: a heat-sink base including a heat-generating device mounting surface, a heat-pipe landing section set below the heat-generating device mounting surface, a cantilever ledge, and an access opening in the heat-sink base; a pedestal; a heat pipe including a pedestal section and a landing section that are separated by a cantilever section, wherein the heat pipe is physically attached to the pedestal at the pedestal section and physically attached to the heat-sink base at the heat-pipe landing section, wherein the heat pipe forms a cantilever at the cantilever ledge between the heat-pipe landing section and the pedestal section, and wherein the pedestal is suspended above the access opening.

In Example 2, the subject matter of Example 1 optionally includes wherein the cantilever ledge is a cantilever step, further including a recess set below the heat-pipe landing section and set apart from the heat-pipe landing section by the cantilever step.

In Example 3, the subject matter of Example 2 optionally includes wherein the heat-generating device mounting surface is a printed wiring board (PWB) mounting surface, further including: a printed wiring board (PWB) including a heat-sink base mounting surface that is assembled to the PWB mounting surface, and a massive antenna array (MAA) mounting surface; a massive antenna array (MAA) package substrate including a die side and an antenna-array side, wherein the MAA package substrate is mounted on the MAA mounting surface; a millimeter-wave (mmWave) antenna array disposed on the antenna-array side; a semiconductive mmWave device including an active surface and a backside surface, wherein the semiconductive mmWave device is flip-chip mounted on the die side; and wherein the pedestal is physically bonded to the backside surface.

In Example 4, the subject matter of Example 3 optionally includes a front enclosure that mates to the heat-sink base and that exposes the mmWave antenna array.

In Example 5, the subject matter of any one or more of Examples 3-4 optionally include the pedestal is bonded to the semiconductive mmWave device through a thermal interface material (TIM), wherein the TIM has a bond-line thickness (BLT) in a range from 20 micrometer (μm) to 50 μm.

In Example 6, the subject matter of any one or more of Examples 3-5 optionally include the pedestal is bonded to the semiconductive mmWave device through a TIM, wherein the TIM has a BLT in a range from 25 μm to 40 μm.

In Example 7, the subject matter of any one or more of Examples 3-6 optionally include wherein the PWB includes a through hole through which the pedestal inserts; and an electrical bump array disposed on the MAA package substrate die side that surrounds the semiconductive mmWave device, wherein the electrical bump array is also disposed on the PWB.

In Example 8, the subject matter of any one or more of Examples 3-7 optionally include wherein the heat-sink base includes a raised cooling structure and the PWB mounting surface is on a side opposite the raised cooling structure.

In Example 9, the subject matter of any one or more of Examples 3-8 optionally include wherein the heat-sink base includes a raised cooling structure and the PWB mounting surface is on a side opposite the raised cooling structure, further including an enclosure that covers the semiconductive mmWave device that is attached to the pedestal and exposes the mmWave antenna array.

In Example 10, the subject matter of any one or more of Examples 3-9 optionally include wherein the PWB includes a through hole through which the pedestal inserts; an electrical bump array disposed on the MAA package substrate die side that surrounds the semiconductive mmWave device, wherein the electrical bump array is also disposed on the PWB; and a front enclosure that mates to the heat-sink base and that exposes the mmWave antenna array.

In Example 11, the subject matter of any one or more of Examples 3-10 optionally include wherein the cantilever step is a first step and the heat pipe is a first heat pipe, and wherein the first heat pipe pedestal section is exposed through the opening, further including: a subsequent heat pipe including a pedestal section and a landing section that are separated by a cantilever section, wherein the landing section is attached to a landing on the heat-sink base wherein the subsequent heat pipe landing section and the first heat pipe landing section are separated by the first heat pipe cantilever section, the subsequent heat pipe cantilever section, the first heat pipe pedestal section and the subsequent heat pipe pedestal section; wherein the pedestal is a first pedestal, further including a subsequent pedestal attached to the subsequent heat pipe pedestal section; wherein the PWB includes a through hole through which the first pedestal inserts, and a subsequent through hole through the subsequent pedestal inserts; and an electrical bump array disposed on the MAA package substrate die side that surrounds the semiconductive millimeter-wave device, wherein the electrical bump array is also disposed on the printed wiring board.

In Example 12, the subject matter of Example 11 optionally includes a front enclosure that mates to the heat-sink base and that exposes the mmWave antenna array.

In Example 13, the subject matter of any one or more of Examples 3-12 optionally include wherein the semiconductive millimeter-wave device is a first semiconductive mmWave device, further including: a second- third- and fourth semiconductive mmWave device, each including an active surface and a backside surface, each of which is flip-chip mounted on the MAA package substrate die side, wherein each of the first, second, third and fourth semiconductive mmWave device is physically attached to the pedestal at respective backside surfaces; wherein the PWB includes a through hole through which the pedestal inserts; an electrical bump array disposed on the MAA package substrate die side that surrounds the semiconductive mmWave devices, wherein the electrical bump array is also disposed on the printed wiring board.

In Example 14, the subject matter of any one or more of Examples 1-13 optionally include wherein the MAA package substrate is a first MAA package substrate, further including subsequent, third and fourth MAA package substrates; wherein the semiconductive millimeter-wave device is a first semiconductive millimeter-wave device and including second, third and subsequent semiconductive millimeter-wave devices; wherein the heat pipe is a first heat pipe, further including subsequent, third and fourth heat pipes; wherein the pedestal is a first pedestal, further including subsequent, third and fourth pedestals; wherein each millimeter-wave device is flip-chip mounted on a respective MAA package substrate die side, wherein each millimeter-wave device is physically attached to a respective pedestal at respective backside surfaces; wherein each pedestal is attached to a respective heat pipe; a printed wiring board including through holes through which each respective pedestal inserts; and electrical bump arrays disposed on each respective MAA package substrate die side that surrounds the each respective semiconductive mmWave device, wherein each electrical bump array is also disposed on the printed wiring board.

In Example 15, the subject matter of any one or more of Examples 3-14 optionally include wherein the heat pipe is a first heat pipe, wherein the cantilever step is a first heat-sink step, and wherein the pedestal is a first pedestal, further including: a third heat pipe also attached to the first heat-sink cantilever step; a subsequent and a fourth heat pipe, each physically attached to a subsequent heat-sink cantilever step, wherein the first and subsequent heat-sink cantilever steps are part of the heat-sink base.

In Example 16, the subject matter of any one or more of Examples 3-15 optionally include wherein the heat pipe is a first heat pipe, wherein the step is a first heat-sink cantilever step, and wherein the pedestal is a first pedestal, further including: a third heat pipe also disposed on the first heat-sink cantilever step; a subsequent and a fourth heat pipe physically attached to a subsequent heat-sink cantilever step, wherein the first and subsequent heat-sink cantilever steps are part of the heat-sink base.

Example 17 is a method of operating a massive antenna array (MAA) apparatus, comprising: generating a millimeter-wave signal from a semiconductive millimeter-wave device and a millimeter-wave antenna array, wherein during generating the millimeter-wave signal, the semiconductive millimeter-wave device moves upon a heat pipe by thermal-expansion and contraction activity, and wherein the heat pipe has a cantilevered configuration to a heat-sink base, and wherein the semiconductive millimeter-wave device moves independently from the heat-sink base.

In Example 18, the subject matter of Example 17 optionally includes wherein the heat pipe includes a pedestal section and a landing section that are separated by a cantilever section, wherein the heat pipe is attached to a pedestal at the pedestal section, and wherein the heat pipe is attached to the heat-sink base at the heat pipe at the landing section, wherein the heat-sink base includes a step from which the heat pipe forms a cantilever between the landing section and the pedestal section.

Example 19 is a method of assembling a massive array antenna to a heat-sink base, comprising: assembling a semiconductive millimeter-wave device to a MAA package substrate, wherein the semiconductive millimeter-wave device includes an active surface and a backside surface, and wherein the semiconductive millimeter-wave device is assembled to the MAA package substrate at the active surface; attaching the semiconductive millimeter-wave device to a cantilevered heat pipe at the backside surface; and attaching the cantilevered heat pipe to the heat-sink base across a cantilever step in the heat-sink base.

In Example 20, the subject matter of Example 19 optionally includes assembling the MAA package substrate to a printed wiring board (PWB) by inserting the semiconductive mmWave device through a cutout in the PWB; and bonding an electrical bump to both the MAA package substrate and the PWB.

In Example 21, the subject matter of any one or more of Examples 19-20 optionally include assembling the MAA package substrate to a printed wiring board (PWB) by inserting the semiconductive mmWave device through a cutout in the PWB; bonding an electrical bump to both the MAA package substrate and the PWB; and wherein attaching the semiconductive millimeter-wave device to the cantilevered heat pipe at the backside surface includes attaching a thermal interface material to the semiconductive mmWave die at the backside surface.

In Example 22, the subject matter of any one or more of Examples 19-21 optionally include assembling the MAA package substrate to a printed wiring board (PWB) by inserting the semiconductive mmWave device through a cutout in the PWB; bonding an electrical hump to both the MAA package substrate and the PWB; wherein attaching the semiconductive millimeter-wave device to the cantilevered heat pipe at the backside surface includes attaching a thermal interface material (TIM) to the semiconductive mmWave die at the backside surface; and attaching the TIM to a pedestal and attaching the pedestal to the cantilevered heat pipe.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A heat-transfer apparatus, comprising:
   a heat-sink base including a heat-generating device mounting surface, a heat-pipe landing section set below the heat-generating device mounting surface, a cantilever ledge, and an access opening in the heat-sink base;
   a pedestal;
   a heat pipe including a pedestal section and a landing section that are separated by a cantilever section, wherein the heat pipe is physically attached to the pedestal at the pedestal section and physically attached to the heat-sink base at the heat-pipe landing section, wherein the heat pipe forms a cantilever at the cantilever ledge between the heat-pipe landing section and the pedestal section, and wherein the pedestal is suspended above the access opening.

2. The heat-transfer apparatus of claim 1, wherein the cantilever ledge is a cantilever step, further including a recess set below the heat-pipe landing section and set apart from the heat-pipe landing section by the cantilever step.

3. The heat-transfer apparatus of claim 2, wherein the heat-generating device mounting surface is a printed wiring board (PWB) mounting surface, further including:
   a printed wiring board (PWB) including a heat-sink base mounting surface that is assembled to the PWB mounting surface, and a massive antenna array (MAA) mounting surface;
   a massive antenna array (MAA) package substrate including a die side and an antenna-array side, wherein the MAA package substrate is mounted on the MAA mounting surface;
   a millimeter-wave (mmWave) antenna array disposed on the antenna-array side;
   a semiconductive mmWave device including an active surface and a backside surface, wherein the semiconductive mmWave device is flip-chip mounted on the die side; and
   wherein the pedestal is physically bonded to the backside surface.

4. The heat-transfer apparatus of claim 3, further including a front enclosure that mates to the heat-sink base and that exposes the mmWave antenna array.

5. The heat-transfer apparatus of claim 3, wherein the pedestal is bonded to the semiconductive millimeter-wave device through a thermal interface material (TIM), wherein the TIM has a bond-line thickness (BLT) in a range from 20 micrometer (µm) to 50 µm.

6. The heat-transfer apparatus of claim 3, wherein the pedestal is bonded to the semiconductive millimeter-wave device through a TIM, wherein the TIM has a BLT in a range from 25 µm to 40 µm.

7. The heat-transfer apparatus of claim 3, wherein the PWB includes a through hole through which the pedestal inserts; and
   an electrical bump array disposed on the MAA package substrate die side that surrounds the semiconductive mmWave device, wherein the electrical bump array is also disposed on the PWB.

8. The heat-transfer apparatus of claim 3, wherein the heat-sink base includes a raised cooling structure and the PWB mounting surface is on a side opposite the raised cooling structure.

9. The heat-transfer apparatus of claim 3, wherein the heat-sink base includes a raised cooling structure and the PWB mounting surface is on a side opposite the raised cooling structure, further including an enclosure that covers the semiconductive mmWave device that is attached to the pedestal and exposes the mmWave antenna array.

10. The heat-transfer apparatus of claim 3, wherein the PWB includes a through hole through which the pedestal inserts;
   an electrical bump array disposed on the MAA package substrate die side that surrounds the semiconductive mmWave device, wherein the electrical bump array is also disposed on the PWB; and
   a front enclosure that mates to the heat-sink base and that exposes the mmWave antenna array.

11. The heat-transfer apparatus of claim 3, wherein the cantilever step is a first step and the heat pipe is a first heat pipe, and wherein the first heat pipe pedestal section is exposed through the access opening, further including:
   a subsequent heat pipe including a pedestal section and a landing section that are separated by a cantilever section, wherein the landing section is attached to a landing on the heat-sink base wherein the subsequent heat pipe landing section and the first heat pipe landing section are separated by the first heat pipe cantilever section, the subsequent heat pipe cantilever section, the first heat pipe pedestal section and the subsequent heat pipe pedestal section;
   wherein the pedestal is a first pedestal, further including a subsequent pedestal attached to the subsequent heat pipe pedestal section;
   wherein the PWB includes a through hole through which the first pedestal inserts, and a subsequent through hole through the subsequent pedestal inserts; and
   an electrical bump array disposed on the MAA package substrate die side that surrounds the semiconductive millimeter-wave device, wherein the electrical bump array is also disposed on the printed wiring board.

12. The heat-transfer apparatus of claim 11, further including a front enclosure that mates to the heat-sink base and that exposes the mmWave antenna array.

13. The heat-transfer apparatus of claim 3, wherein the semiconductive millimeter-wave device is a first semiconductive mmWave device, further including:
   a second- third- and fourth semiconductive mmWave device, each including an active surface and a backside surface, each of which is flip-chip mounted on the MAA package substrate die side, wherein each of the first, second, third and fourth semiconductive mmWave device is physically attached to the pedestal at respective backside surfaces;
   wherein the PWB includes a through hole through which the pedestal inserts;
   an electrical bump array disposed on the MAA package substrate die side that surrounds the semiconductive mmWave devices, wherein the electrical bump array is also disposed on the printed wiring board.

14. The heat-transfer apparatus of claim 3, wherein the heat pipe is a first heat pipe, wherein the cantilever step is a first heat-sink step, and wherein the pedestal is a first pedestal, further including:
   a third heat pipe also attached to the first heat-sink cantilever step;
   a subsequent and a fourth heat pipe, each physically attached to a subsequent heat-sink cantilever step, wherein the first and subsequent heat-sink cantilever steps are part of the heat-sink base.

15. The heat-transfer apparatus of claim 3, wherein the heat pipe is a first heat pipe, wherein the cantilever step is a first heat-sink cantilever step, and wherein the pedestal is a first pedestal, further including:
   a third heat pipe also disposed on the first heat-sink cantilever step;
   a subsequent and a fourth heat pipe physically attached to a subsequent heat-sink cantilever step, wherein the first and subsequent heat-sink cantilever steps are part of the heat-sink base.

16. The heat-transfer apparatus of claim 1, further including:
   wherein the MAA package substrate is a first MAA package substrate, further including subsequent, third and fourth MAA package substrates;
   wherein the semiconductive millimeter-wave device is a first semiconductive millimeter-wave device and including subsequent, third and fourth semiconductive millimeter-wave devices;
   wherein the heat pipe is a first heat pipe, further including subsequent, third and fourth heat pipes;
   wherein the pedestal is a first pedestal, further including subsequent, third and fourth pedestals;
   wherein each millimeter-wave device is flip-chip mounted on a respective MAA package substrate die side, wherein each millimeter-wave device is physically attached to a respective pedestal at respective backside surfaces;
   wherein each pedestal is attached to a respective heat pipe;
   a printed wiring board including through holes through which each respective pedestal inserts; and
   electrical bump arrays disposed on each respective MAA package substrate die side that surrounds the each respective semiconductive mmWave device, wherein each electrical bump array is also disposed on the printed wiring board.

17. A heat-transfer apparatus, comprising:
   a heat-sink base including a heat-generating device mounting surface, wherein the heat-generating device mounting surface is a printed wiring board (PWB) mounting surface, a heat-pipe landing section set below the heat-generating device mounting surface, a cantilever ledge, and an access opening in the heat-sink base, wherein the cantilever ledge is a cantilever step;
   a pedestal;
   a heat pipe including a pedestal section and a landing section that are separated by a cantilever section, wherein the heat pipe is physically attached to the pedestal at the pedestal section and physically attached to the heat-sink base at the heat-pipe landing section, wherein the heat pipe forms a cantilever at the cantilever ledge between the heat-pipe landing section and the pedestal section, and wherein the pedestal is suspended above the access opening;
   a recess set below the heat-pipe landing section and set apart from the heat-pipe landing section by the cantilever step;
   a printed wiring board (PWB) including a heat-sink base mounting surface that is assembled to the PWB mounting surface, a massive antenna array (MAA) mounting surface, and wherein the PWB includes a through hole through which the pedestal inserts;
   a massive antenna array (MAA) package substrate including a die side and an antenna-array side, wherein the MAA package substrate is mounted on the MAA mounting surface;
   an electrical bump array disposed on the MAA package substrate die side that surrounds the semiconductive mmWave device, wherein the electrical bump array is also disposed on the PWB;
   a millimeter-wave (mmWave) antenna array disposed on the antenna-array side;

a semiconductive mmWave device including an active surface and a backside surface, wherein the semiconductive mmWave device is flip-chip mounted on the die side;

wherein the pedestal is physically bonded to the backside surface; and a front enclosure that mates to the heat sink base and that exposes the mmWave antenna array.

18. The heat-transfer apparatus of claim 17, wherein the heat-sink base includes a raised cooling structure and the PWB mounting surface is on a side opposite the raised cooling structure.

19. The heat-transfer apparatus of claim 17, wherein the heat pipe is a first heat pipe, wherein the step is a first heat-sink cantilever step, and wherein the pedestal is a first pedestal, further including:

a third heat pipe also disposed on the first heat-sink cantilever step;

a subsequent and a fourth heat pipe physically attached to a subsequent heat-sink cantilever step, wherein the first and subsequent heat-sink cantilever steps are part of the heat-sink base.

20. The heat-transfer apparatus of claim 17, further including:

wherein the MAA package substrate is a first MAA package substrate, further including subsequent, third and fourth MAA package substrates;

wherein the semiconductive millimeter-wave device is a first semiconductive millimeter-wave device and including second, third and subsequent semiconductive millimeter-wave devices;

wherein the heat pipe is a first heat pipe, further including subsequent, third and fourth heat pipes;

wherein the pedestal is a first pedestal, further including subsequent, third and fourth pedestals;

wherein each millimeter-wave device is flip-chip mounted on a respective MAA package substrate die side, wherein each millimeter-wave device is physically attached to a respective pedestal at respective backside surfaces;

wherein each pedestal is attached to a respective heat pipe;

a printed wiring board including through holes through which each respective pedestal inserts; and electrical bump arrays disposed on each respective MAA package substrate die side that surrounds the each respective semiconductive mmWave device, wherein each electrical hump array is also disposed on the printed wiring board.

21. A heat-transfer apparatus, comprising:

a heat-sink base including a heat-generating device mounting surface, wherein the heat-generating device mounting surface is a printed wiring board (PWB) mounting surface, a heat-pipe landing section set below the heat-generating device mounting surface, a cantilever ledge, and an access opening in the heat-sink base, wherein the cantilever ledge is a cantilever step;

a pedestal;

a heat pipe including a pedestal section and a landing section that are separated by a cantilever section, wherein the heat pipe is physically attached to the pedestal at the pedestal section and physically attached to the heat-sink base at the heat-pipe landing section, wherein the heat pipe forms a cantilever at the cantilever ledge between the heat-pipe landing section and the pedestal section, and wherein the pedestal is suspended above the access opening;

a recess set below the heat-pipe landing section and set apart from the heat-pipe landing section by the cantilever step;

a printed wiring board (PWB) including a heat-sink base mounting surface that is assembled to the PWB mounting surface, a massive antenna array (MAA) mounting surface, and wherein the PWB includes a through hole through which the pedestal inserts;

a massive antenna array (MAA) package substrate including a die side and an antenna-array side, wherein the MAA package substrate is mounted on the MAA mounting surface;

an electrical bump array disposed on the MAA package substrate die side that surrounds the semiconductive mmWave device, wherein the electrical bump array is also disposed on the PWB;

a millimeter-wave (mmWave) antenna array disposed on the antenna-array side;

a semiconductive mmWave device including an active surface and a backside surface, wherein the semiconductive mmWave device is flip-chip mounted on the die side, wherein the pedestal is bonded to the semiconductive millimeter-wave device through a thermal interface material (TIM), wherein the TIM has a bond-line thickness (BLT) in a range from 20 micrometer ($\mu$m) to 50 $\mu$m; and wherein the pedestal is physically bonded to the backside surface.

22. The heat-transfer apparatus of claim 21, wherein the heat-sink base includes a raised cooling structure and the PWB mounting surface is on a side opposite the raised cooling structure, further including an enclosure that covers the semiconductive mmWave device that is attached to the pedestal and exposes the mmWave antenna array;

wherein the PWB includes a through hole through which the pedestal inserts;

an electrical bump array disposed on the MAA package substrate die side that surrounds the semiconductive mmWave device, wherein the electrical bump array is also disposed on the PWB; and a front enclosure that mates to the heat-sink base and that exposes the mmWave antenna array.

* * * * *